(12) United States Patent
Strzalkowski et al.

(10) Patent No.: US 8,446,243 B2
(45) Date of Patent: May 21, 2013

(54) METHOD OF CONSTRUCTING INDUCTORS AND TRANSFORMERS

(75) Inventors: Bernhard Strzalkowski, Munich (DE); Marco Seibt, Villach (AT); Ulrich Schwarzer, Warstein (DE)

(73) Assignee: Infineon Technologies Austria AG, Villach (AT)

( * ) Notice: Subject to any disclaimer, the term of this patent is extended or adjusted under 35 U.S.C. 154(b) by 610 days.

(21) Appl. No.: 12/262,816

(22) Filed: Oct. 31, 2008

(65) Prior Publication Data

US 2010/0109123 A1 May 6, 2010

(51) Int. Cl.
*H01F 5/00* (2006.01)
*H01F 17/04* (2006.01)
*H01L 21/00* (2006.01)

(52) U.S. Cl.
USPC .................... 336/200; 336/221; 257/531

(58) Field of Classification Search .......... 336/186, 336/200, 232, 223; 257/531; 438/3, 127
See application file for complete search history.

(56) References Cited

U.S. PATENT DOCUMENTS

| | | | | |
|---|---|---|---|---|
| 5,349,743 | A * | 9/1994 | Grader et al. ............... 29/602.1 |
| 5,781,091 | A * | 7/1998 | Krone et al. .................. 336/200 |
| 5,959,846 | A * | 9/1999 | Noguchi et al. .............. 361/782 |
| 6,927,662 | B2 * | 8/2005 | Kahlmann et al. ............ 336/200 |
| 6,989,296 | B2 * | 1/2006 | Huang et al. .................. 438/127 |
| 7,209,026 | B2 * | 4/2007 | Frutschy et al. .............. 336/200 |
| 7,233,224 | B2 * | 6/2007 | Strzalkowski et al. ........ 336/200 |
| 7,375,609 | B2 * | 5/2008 | Suzuki et al. ................. 336/200 |
| 7,489,226 | B1 * | 2/2009 | Chignola et al. .............. 336/229 |
| 7,518,480 | B1 * | 4/2009 | Dening et al. ................. 336/200 |
| 7,579,197 | B1 * | 8/2009 | Li ..................................... 438/3 |
| 7,781,231 | B2 * | 8/2010 | Li ..................................... 438/3 |
| 7,885,105 | B2 * | 2/2011 | Li et al. ......................... 365/173 |
| 7,915,991 | B2 * | 3/2011 | Waffenschmidt et al. ..... 336/200 |
| 7,955,868 | B2 * | 6/2011 | Lotfi et al. ......................... 438/3 |
| 8,247,855 | B2 * | 8/2012 | Summerfelt ................... 257/295 |

(Continued)

FOREIGN PATENT DOCUMENTS

DE 10232642 2/2004

OTHER PUBLICATIONS

Yamaguchi, K., et al. "Characteristics of a Thin Film Microtransformer with Circular Spiral Coils," IEEE, Transactions on Magnetics, vol. 29, No. 5, Sep. 1993, pp. 2232-2237.

(Continued)

*Primary Examiner* — Mohamad Musleh
*Assistant Examiner* — Joselito Baisa
(74) *Attorney, Agent, or Firm* — Slater & Matsil, L.L.P.

(57) ABSTRACT

An embodiment of the invention relates to an apparatus including a magnetic device and a related method. A multilayer substrate is constructed with a winding formed in a metallic layer, an electrically insulating layer above the metallic layer, and a via formed in the electrically insulating layer to couple the winding to a circuit element positioned on the multilayer substrate. A depression is formed in the multilayer substrate, and a polymer solution, preferably an epoxy, containing a ferromagnetic component such as nanocrystalline nickel zinc ferrite is deposited within a mold positioned on a surface of the multilayer substrate above the winding and in the depression. An integrated circuit electrically coupled to the winding may be located on the multilayer substrate. The multilayer substrate may be a semiconductor substrate or a printed wiring board, and the circuit element may be an integrated circuit formed on the multilayer substrate.

43 Claims, 7 Drawing Sheets

U.S. PATENT DOCUMENTS

| | | | |
|---|---|---|---|
| 8,252,615 B2* | 8/2012 | Jang et al. | 438/64 |
| 2002/0050626 A1* | 5/2002 | Onuma et al. | 257/531 |
| 2007/0030107 A1 | 2/2007 | Waffenschmidt et al. | |
| 2007/0030659 A1 | 2/2007 | Suzuki et al. | |
| 2009/0008777 A1* | 1/2009 | Lin et al. | 257/738 |
| 2009/0153229 A1* | 6/2009 | Hanke et al. | 327/530 |
| 2009/0280646 A1* | 11/2009 | Iwaya et al. | 438/666 |

OTHER PUBLICATIONS

Jones, G., "Miniature solutions for voltage isolation," Analog Applications Journal, Texas Instruments Incorporated, www.ti.com/aaj, 2005, pp. 13-18.

Jones, G., "Miniature Solutions for Voltage Isolation," Texas Instruments Incorporated, Power Management, Analog Applications Journal, www.ti.com/aaj; 2005, pp. 13-18.

* cited by examiner

METHOD OF CONSTRUCTING INDUCTORS AND TRANSFORMERS

TECHNICAL FIELD

An embodiment of the invention relates generally to constructing magnetic devices, and in particular, to forming a magnetic device such as an inductor or a transformer on a substrate, such as a printed wiring board or a semiconductor substrate.

BACKGROUND

With the increasing complexity and level of integration of electronic products, there is a growing need for distributed and independent power conversion devices, such as point-of-load voltage sources, to provide the well-regulated bias voltages for the highly integrated semiconductor devices that are commonly used. Highly integrated semiconductor devices frequently operate from specialized bias voltages. The power conversion devices must be economical and formed with very small dimensions to meet the size and portability needs of these markets, particularly markets that include portable and compact products such as cellular telephones and personal computers.

A power converter is conventionally formed with discrete magnetic devices such as transformers and inductors that are necessary in the design to achieve high power conversion efficiency. Such magnetic devices generally consist of electrically conductive windings, a body ("bobbin") to support the windings, and a ferromagnetic core to provide a sufficiently high level of magnetic flux density for a given level of current in the windings. The assembly is generally mounted on a printed wiring board ("PWB") for interconnection with other circuit elements.

A known technique to form magnetic devices is to employ planar windings that are formed directly in the buried metallic layers of a PWB. Exemplary magnetic cores that can be used with such structures are "EI" and "EE" core forms, so named for the corresponding shapes of the letters "E" and "I," and produced by companies such as EPCOS and Philips. To insert and secure such cores to a PWB, apertures with complex and precise shapes must be milled in the PWB. Milling of such apertures in a PWB is generally a more costly mechanical operation than, for example, drilling of holes.

Power converters are also manufactured with discrete magnetic devices in an integrated circuit-size ("IC") package, such as the DCR010505 power converter produced by Texas Instruments, Inc., to achieve a small physical size, as described by Geoff Jones in the paper entitled "Miniature Solutions for Voltage Isolation," Texas Instruments' Analog Applications Journal, dated 3Q2005, pages 13-17. However, such power converters are generally larger than the needs of the more challenging markets for compact circuit devices, particularly for low power applications, and are produced at costs that do not meet the needs of high-volume production.

To produce inductors and transformers with small dimensions, studies have been undertaken to incorporate buried copper conductors within surrounding layers of a ferromagnetic film, for example, the study described by K. Yamaguchi, et al., in the paper entitled "Characteristic of a Thin Film Microtransformer with Circular Spiral Coils," published in the IEEE Transaction on Magnetics, Vol. 29, No. 5, September 1993. The fabrication procedure described by Yamaguchi includes depositing a sputtered magnetic film that is then patterned using a photoresist. Copper windings are deposited by an electroplating process to produce a compact magnetic design. However, the overall process is not practical for a high-volume, low-cost production sequence in view of the complexity of the manufacturing steps that are necessary to produce a workable product.

Thus, there is a need for a process and related method to produce a magnetic device with very small physical dimensions that are adaptable to high volume and low cost manufacturing processes to meet the more challenging market needs that lie ahead that avoids the disadvantages of conventional approaches.

SUMMARY OF THE INVENTION

In accordance with an exemplary embodiment, an apparatus including a magnetic device and a related method are provided. In an embodiment, a multilayer substrate is constructed with a first winding formed in a first metallic layer of the multilayer substrate, a first electrically insulating layer formed above the first metallic layer, and a first via formed in the first electrically insulating layer. The first via couples the first winding to a circuit element positioned on the multilayer substrate. A depression is formed in the multilayer substrate, and a polymer solution containing a ferromagnetic component is deposited on a surface of the multilayer substrate above the first winding and in the depression. The polymer solution is preferably an epoxy, but another polymer solution may be used. The ferromagnetic component preferably contains nanocrystaline nickel zinc ferrite, but another ferromagnetic material may be used. In an embodiment, the depression incompletely penetrates the multilayer substrate. Preferably, the polymer solution is deposited within a mold positioned on a surface of the multilayer substrate to form the shape of the polymer solution after curing. The multilayer substrate may be a printed wiring board. In an embodiment, an integrated circuit is located on the multilayer substrate that is electrically coupled to the first winding. In an embodiment, the apparatus may be formed as a power conversion device. In a further embodiment, a second insulating layer is formed on the multilayer substrate below the first metallic layer, and a second winding of the magnetic device is formed in a second metallic layer of the multilayer substrate to form additional turns for a winding of the magnetic device. The second metallic layer is formed on the multilayer substrate below the second insulating layer, and a second via is formed in the second insulating layer. The second via electrically couples the second winding to the first winding. Preferably, the first via and the second via are metallic vias. In a further embodiment, a third insulating layer is formed on the multilayer substrate below the second metallic layer, and a third metallic layer is formed on the multilayer substrate below the third insulating layer. The third metallic layer forms a further winding of the magnetic device dielectrically insulated from the first winding to form dielectrically insulated transformer windings. A third via is formed in the third insulating layer to provide an electrical coupling of the further winding to a further circuit element located on the multilayer substrate. In an embodiment, the multilayer substrate is a semiconductor substrate, and the circuit element is an integrated circuit formed on the multilayer substrate.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, and may be described only once in the interest of brevity. For a more complete understanding of the invention, reference is now made to the following descriptions taken in conjunction with the accompanying drawings, in which:

DETAILED DESCRIPTION OF ILLUSTRATIVE EMBODIMENTS

Figure 1A:
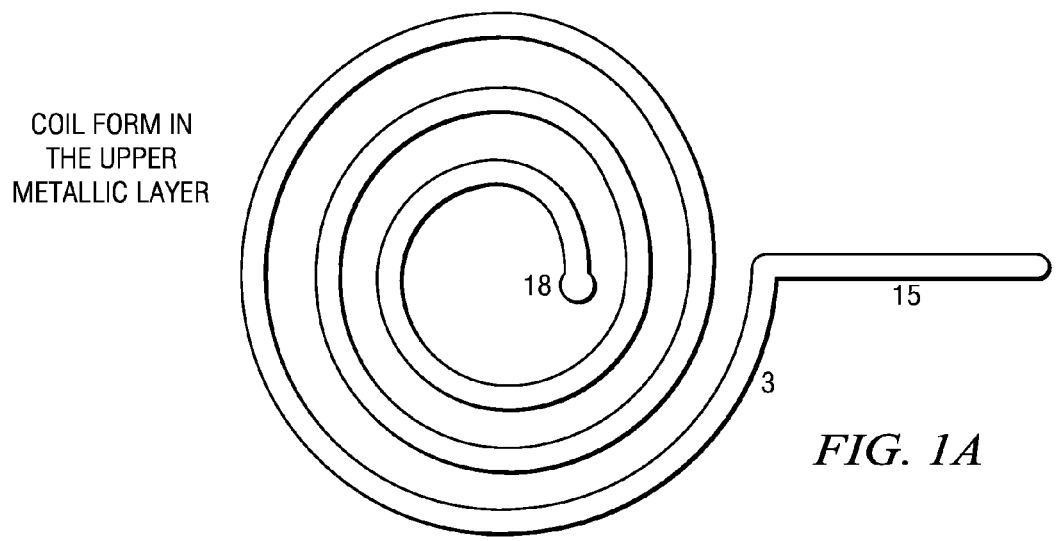
FIGS. 1A, 1B, and 1C illustrate planar-view drawings showing, respectively, the form and arrangement of spiral, planar coils in an upper metallic layer, a lower metallic layer, and the placement of the windings relative to each other, constructed according to an embodiment.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely a magnetic device formed on a substrate with planar windings that produce a magnetic field enhanced by a molded ferromagnetic structure.

An embodiment of the invention may be applied to various electronic power conversion arrangements, for example, to an integrated isolated or nonisolated power converter configured to power an electronic load. Other devices including a magnetic element can be constructed and applied using processes as introduced herein in different contexts using inventive concepts described herein, for example, a filtering arrangement used to shape a spectral characteristic of an analog signal.

As introduced herein, windings of a compact, integrated magnetic device such as a transformer or an inductor are formed on a substrate such as a PWB or a semiconductor substrate. The windings are structured so that no additional electrically conductive lines or other interconnections such as wire bonds are needed to interconnect the metallic layers forming the internal windings of the magnetic device, enabling thereby the production of low-profile structures. To extend the magnetic path of the ferromagnetic layers in various areas of the spiral coils forming the windings, a number of drilled holes and trenches that may not penetrate the substrate are formed. The winding areas are then covered with a polymer solution that contains a soft ferrite such as the nanocrystaline ferrite FeSiBCuNb or nanocrystaline nickel zinc ferrite to form the magnetic core of the medic device. The polymer solution is of a sufficiently low viscosity so that the formed depressions, i.e., the holes and trenches, are readily filled. An exemplary polymer solution such as I-8606M is available from Asahi Kasei, and an exemplary powdered ferrite such as Vitroperm is available from Vacuumschmelze GmbH. The relative permeability value and the saturation flux density of the ferrite-mold compound are dependent on the powder filling content. For a low viscosity polymer, a suitable filling fraction, without limitation, is 60% to 85% of the polymer volume; the relative permeability of the molded material may typically vary from 10 to 40 for the cited powder fraction. The saturation flux density can be expressed according to Kelly, A. W, et al., as described in the paper entitled "Plastic-Iron-Powder Distributed-Air-Gap Magnetic Material," IEEE Power Electronics Specialists Conference, 11 Jun. 1990, pages 25-34, by the equation:

$$B_{sat} = B_{sat\text{-}fill}[x + (1-x)\rho_{pol}/\rho_{fill}], \quad [1]$$

where
$B_{sat\text{-}fill}$=saturation flux density of the filler (ferrite powder)
x=filler fraction by polyimide volume
$\rho_{pol}$=mass density of the polyimide
$\rho_{fill}$=mass density of the ferrite powder The required properties of the magnetic core for optimal energy conversion are influenced by the number of vias at the periphery of the winding and by the thickness of the magnetic layer. For economical implementation of the magnetic circuit, the vias in the middle area of the magnetic device and at the level of winding may be advantageously formed of the same size. The diameter and number of vias formed to contain the polymer solution should be selected in view of expected current levels in the magnetic device to manage saturation of the magnetic material using analytical techniques well known in the art. The sum of the areas of the outer vias is preferably equal to the area of the large via formed in the middle of the magnetic device.

Figure 1B:
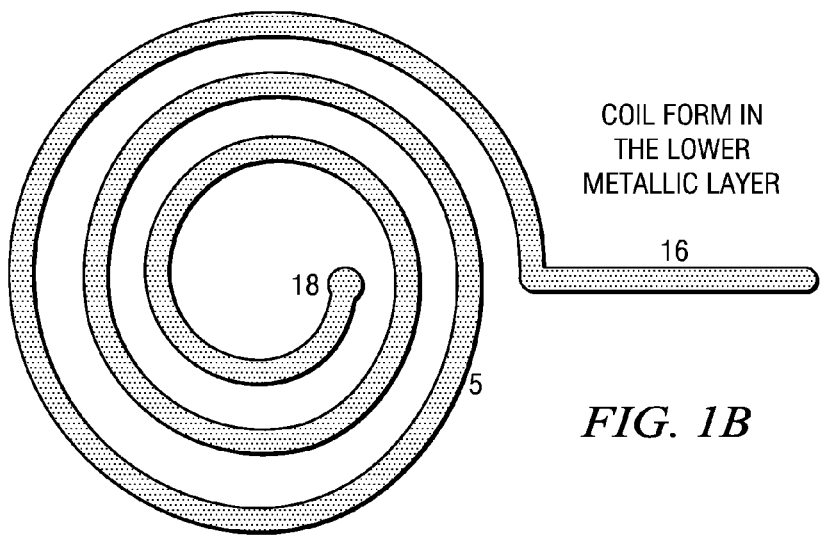
Figure 1C:
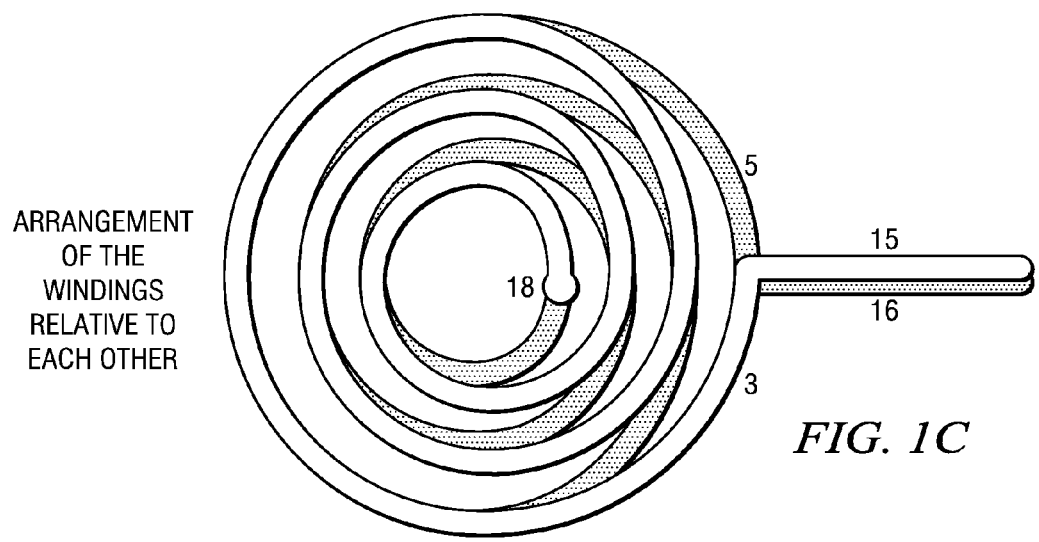

Turning now to FIGS. 1A, 1B, and 1C, illustrated are drawings showing, respectively, the structure and arrangement of spiral, planar coils in an upper metallic layer, a lower metallic layer, and the placement of the windings relative to each other to provide efficient utilization of board area on the internal metallization layers forming a magnetic device, constructed according to an embodiment. Although round spiral structures for the windings are illustrated in the figures herein, other winding structures may be employed within the broad scope of the present invention, such as hexagonal spiral structures. The spiral coils of the upper 3 and the lower 5 spiral metal layers are laid out with opposite geometric winding sense. The inner ends of the upper coil 3 and lower coil 5 are coupled by via 18. This creates a stacked winding, wherein each layer produces a magnetic flux with the same winding sense with respect to flux generation. No other connection is necessary to interconnect the inner end terminal of each winding. This creates a compact, low-profile, planar coil, wherein a higher number of winding turns is produced compared to a single-layer winding arrangement. Accordingly, no connection is needed to form the mid-point (or other tap location) of the winding. The coil ends 15 and 16 are coupled to other electrical circuits, for example, to the integrated circuit IC1 illustrated and described hereinbelow with reference to FIGS. 2 and 3.

Figure 2:
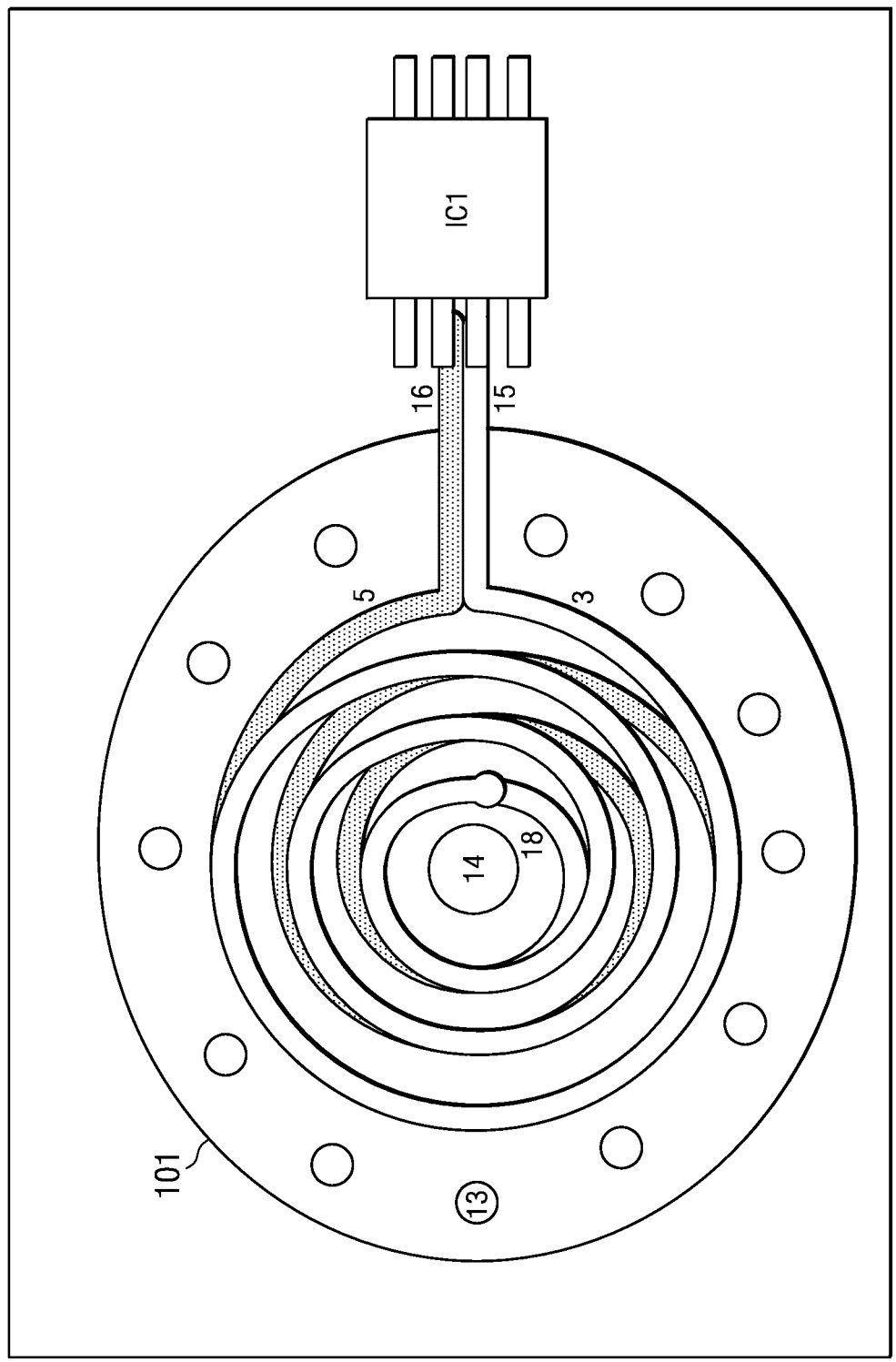
FIG. 2 illustrates a planar-view drawing of an electrical apparatus including a magnetic device formed with spiral windings formed in a two-sided PWB, constructed according to an embodiment.

Turning now to FIG. 2, illustrated is a planar-view drawing of an embodiment of an electrical circuit including a magnetic device formed with spiral windings formed in a two-sided or multilayer PWB 201. The interconnection 15 and 16 between the windings and an IC (IC1) placed on the PWB are shown. The windings are covered with a ferromagnetic layer 101. The ferromagnetic layer 101 fills the inner via 14 and the outer vias such as the outer via 13. The ferromagnetic layer 101 is created by applying a polymer solution such as an epoxy or other plastic material mixed with a ferromagnetic powder, as described previously hereinabove.

Figure 3:
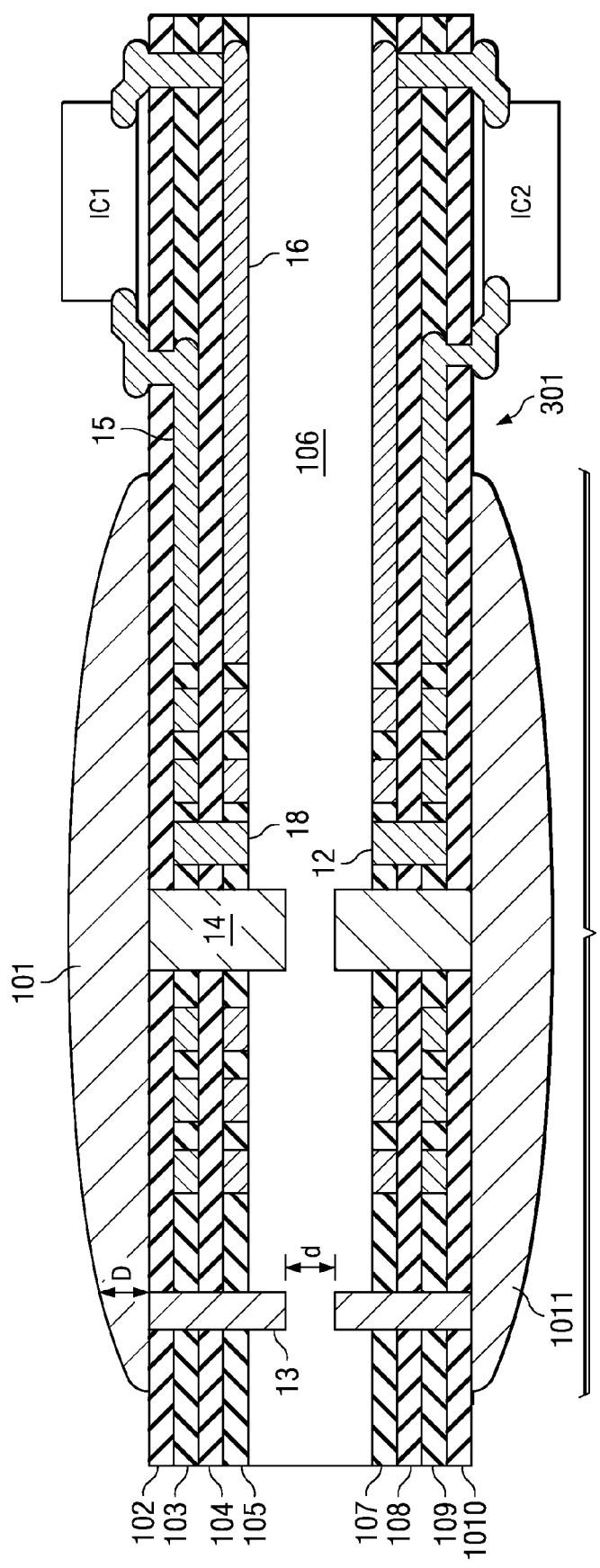
FIG. 3 illustrates an elevation-view drawing of a planar transformer formed on a four-layer PWB, constructed according to an embodiment.

Turning now to FIG. 3, illustrated is an elevation drawing of an embodiment of a planar transformer 302 formed in a four-layer PWB 301. The transformer consists of the following layers and structures:

layers 101 and 1011: ferromagnetic layers,
layer 102: isolation layer (the first passivation layer above the first metallic layer of the first winding),
layer 103: first metallic layer of the first winding,
layer 104: isolation layer between the first and the second metallic layers of the first winding,
layer 105: second metallic layer of the first winding,
layer 106: substrate/isolation layer of the PWB,
layer 107: second metallic layer of the second winding,
1layer 108: isolation layer between the first and the second metallic layers of the second winding,
layer 109: first metallic layer of the second winding,
layer 1010: isolation layer (the second passivation layer below the first metallic layer of the second winding,
12 and 18: vias between upper and lower metallic layers of the first and second windings,
13: outer completely or incompletely drilled via through PWB,
14: inner completely or incompletely drilled via through PWB, and
15 and 16: ends forming the interconnections with the first winding.

In order not to saturate the ferrite layer in the area of the via 13, the viscosity of the solution is preferably selected so that it will be disposed in the region of the via 13 with a thickness that is no less than a certain amount such as the distance D indicated in FIG. 3. The distance D is selected to manage saturation of the magnetic layer; preferably, it is not less than the diameter of via 13. In order to produce increased electrical breakdown voltage between the windings, the holes are not drilled completely through the PWB, as indicated by the separation distance d in FIG. 3. The distance d can also be used to control the effective transformer air gap for the path of the magnetic flux.

Figure 4:
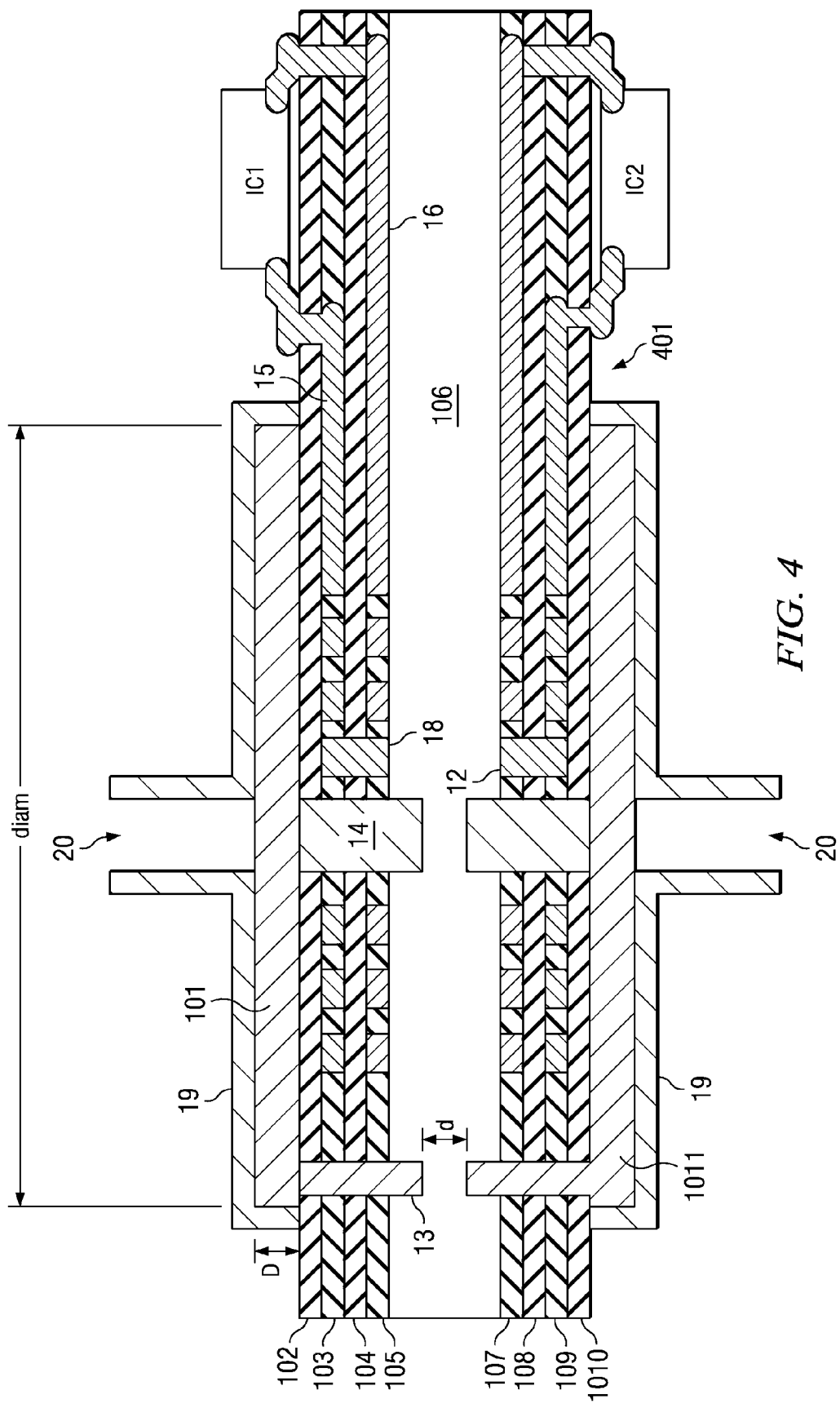
FIG. 4 illustrates an elevation-view drawing showing the use of molds to shape magnetic layers deposited about planar windings, constructed according to an embodiment.

Turning now to FIG. 4, illustrated is an elevation drawing showing an embodiment of the use of molds to shape and control dimensions of the magnetic layers about the planar windings. As illustrated in FIG. 4, the windings of the magnetic device are coupled to integrated circuits IC1 and IC2, such as by winding end 15 that may be formed with a via. A mold for the polymer solution, illustrated as the mold with top and bottom portions identified with reference designation 19 with apertures 20, is placed above the upper and lower surfaces of the PWB 401. The polymer solution containing the ferromagnetic component is introduced through the apertures 20 under pressure to fill the mold and the vias in the PWB.

By selection of the height D and the diameter diam of the mold, the magnetic and electrical characteristics of the core can be determined. If the polymer solution containing the ferromagnetic component is controllably introduced through the vias 14 and 18, the structure of the resulting ferrite core can be constructed with repeatable magnetic and electrical characteristics.

A magnetic device as introduced herein can be characterized, without limitation, as follows: It is not necessary for the magnetic flux of a winding to be completely enclosed in a magnetic layer to obtain a high quality inductor with sufficiently high inductance values for a particular application. A portion of the magnetic flux may lie in air or in other non-ferromagnetic material. The effective permeability of the magnetic path will be increased nonetheless by the presence of the ferromagnetic material, which results in increased inductance of a planar inductor winding formed in the magnetic device. The longer the path of the magnetic flux lies in a ferromagnetic layer, the greater is the resulting device inductance. In this way, an inductance value and a power density of a magnetic device formed with a planar winding can be substantially increased over a comparable device formed without added ferromagnetic material.

Figure 5:
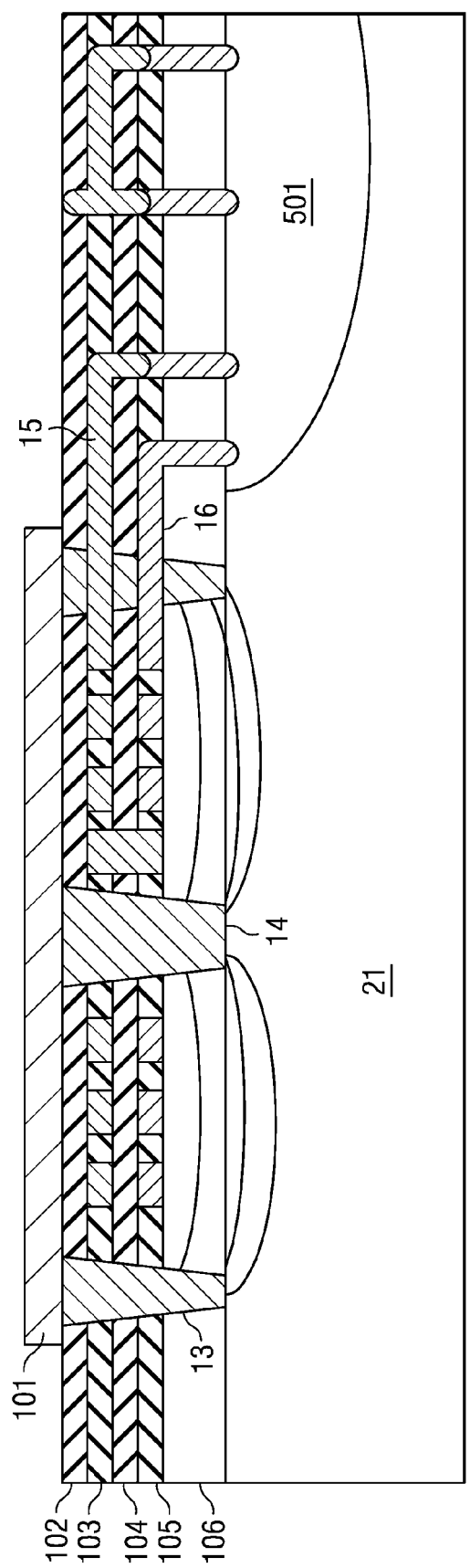
FIG. 5 illustrates an elevation-view drawing showing the structure of a magnetic device wherein a magnetic layer is formed on a semiconductor substrate, constructed according to an embodiment.
Figure 6:
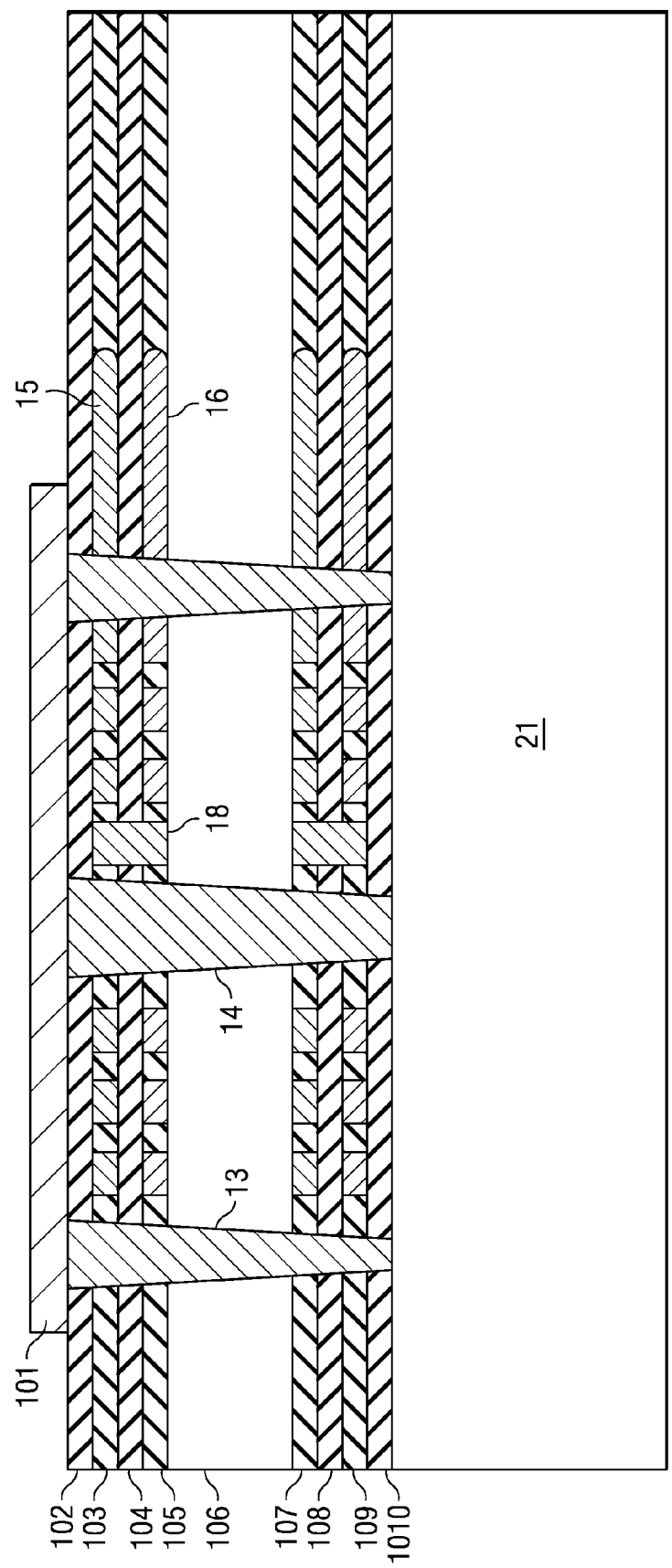
FIG. 6 illustrates a transformer formed on a semiconductor substrate including a primary winding formed on metallic layers that are dielectrically isolated from a secondary winding formed on metallic layers, constructed according to an embodiment.

Turning now to FIG. 5, illustrated is an elevation drawing showing an exemplary embodiment of the structure of a magnetic device, wherein a magnetic layer 101 is formed on a semiconductor substrate 21. The magnetic device is coupled to an integrated circuit 501 by means of vias formed through the isolation layers of the semiconductor device. Unlike the structure of the magnetic devices illustrated in FIGS. 4 and 5, the magnetic flux of the device illustrated in FIG. 6 is less contained within a high permeability magnetic layer, such as the magnetic layers 101 and 1011 illustrated in FIGS. 3 and 4, but traverses longer, low-permeability paths, such as the paths between the trenches 13 and 14. Nonetheless, a sufficiently high permeability path can be obtained to construct a practical high-frequency magnetic device. The trenches 13 and 14 are etched using integrated circuit etching techniques well known in the art, such as, without limitation, by deposition of a photoresist layer, patterning the photoresist layer, reactive-ion etching, and deposition of a metallic layer on the walls of holes and trenches so formed, in the processing steps after forming layers 102 through 106 on the semiconductor substrate 21. Then the magnetic layer 101 is deposited and structured. The deposition of a thin magnetic layer can be performed employing RF sputtering in a PVD (plasma vacuum deposition) process. Structuring of the layer can by realized by means of a photoresist lift-off method. Another method is direct deposition of a photoresist containing a magnetic powder to fill the trenches and to build the upper magnetic layer. The thickness of the layer may be controlled by the rotational speed of the wafer. Structuring of the photoresist then follows. The remaining photoresist structure is preferably not ashed. Instead of the last photoresist, the polyimide containing the magnetic powder can be used. In this way a magnetic circuit is created wherein a magnetic field surrounds a compact, planar winding, and the magnetic field is partially conducted within a high permeability ferromagnetic structure. The magnetic field lines that are conducted between the trenches such as trenches 13 and 14 are conducted through the isolation layers 104 and 106 and the substrate 21 of a semiconductor device. It is also possible to etch vias 13 and 14 entirely though the substrate. In this case, the coupling factor between the primary and secondary winding becomes larger, as well as the primary winding inductance.

Turning now to FIG. 6, illustrated is an exemplary embodiment of a transformer formed on semiconductor substrate 21 including a primary winding formed on metallic layers 103 and 105 that is dielectrically isolated from a secondary winding formed on metallic layers 107 and 109. As illustrated in FIG. 5, the magnetic device may be coupled by means of vias formed through the isolation layers of the semiconductor device to an integrated circuit formed on the substrate. Similar to the magnetic device illustrated in FIG. 5, the magnetic flux of the device illustrated in FIG. 6 is only partially contained within a high permeability magnetic layer.

Figure 7:
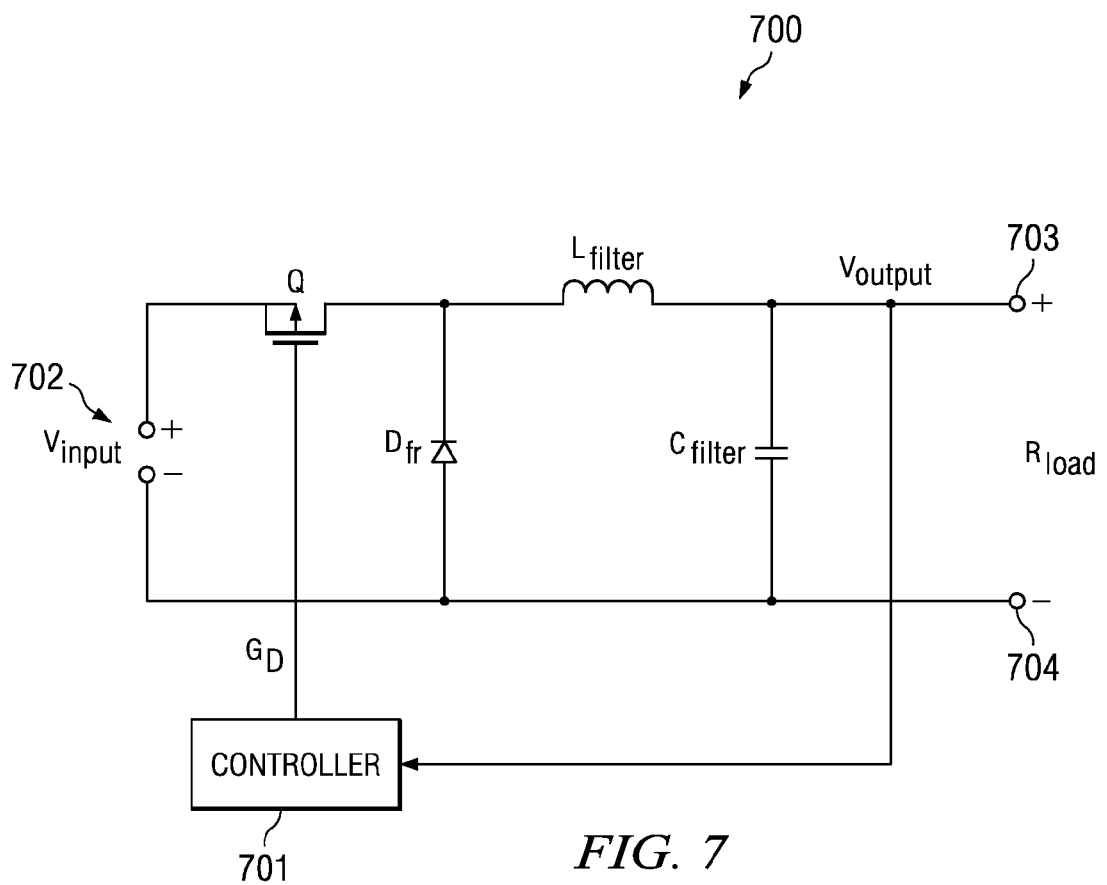
FIG. 7 illustrates a simplified schematic diagram of a switch-mode power converter including an exemplary magnetic circuit element, constructed according to an embodiment.

Referring now to FIG. 7, illustrated is a simplified schematic diagram of a switch-mode power converter 700, including a magnetic circuit element $L_{filter}$, constructed according to an embodiment. The switch-mode power converter 700, a power conversion device, is an exemplary application of a low-profile magnetic element such as the inductor $L_{filter}$ coupled to circuit elements on a PWB or on another substrate such as a semiconductor substrate. The power converter includes a controller 701 constructed as an integrated circuit that regulates the power converter output voltage. The power converter provides dc power to a load $R_{load}$ (not shown) that may be coupled to output terminals 703 and 704. While the illustrated power converter employs a buck converter topology, those skilled in the art should understand that other power converter topologies are well within the broad scope of the present invention.

The power converter receives an input dc voltage $V_{input}$ from a source of electrical power 702 at an input thereof and provides a regulated output voltage $V_{output}$ at output terminals 703 and 704. In keeping with the principles of a buck converter topology, the output voltage $V_{output}$ is generally less than the input voltage $V_{input}$ such that a switching operation of the power switch Q can regulate the output voltage $V_{output}$.

During a first portion of a high-frequency switching cycle of the power converter, the power switch Q, which may be formed as a power MOSFET, is enabled to conduct in response to a gate drive signal GD, coupling the input voltage $V_{input}$ to the filter inductor $L_{filter}$, enabling thereby a current to flow through the filter inductor $L_{filter}$. During the first portion of the high-frequency switching cycle, an inductor current flowing through the output filter inductor $L_{filter}$ increases as current flows from the input to the output of the power train. An ac component of the inductor current is filtered by the output filter capacitor $C_{filter}$.

During a complementary portion of the switching cycle, the power switch Q is transitioned to a non-conducting state, and a freewheeling diode $D_{fr}$ coupled to the filter inductor $L_{filter}$ becomes forward biased. The diode $D_{fr}$ provides a current path to maintain continuity of inductor current flowing through the filter inductor $L_{filter}$. During the complementary portion of the switching cycle, the inductor current flowing through the filter inductor $L_{filter}$ decreases. In general, the first portion of the high-frequency switching cycle of the power switch Q may be adjusted to regulate the output voltage $V_{output}$ of the power converter.

The controller 701 of the power converter receives the output voltage $V_{output}$ of the power converter and a desired system voltage. The controller 701 adjusts the first portion of the high-frequency switching cycle to regulate the output voltage $V_{output}$ at the desired system voltage.

The concept has thus been introduced of constructing a multilayer substrate with a first winding of a magnetic device formed in a first metallic layer of the multilayer substrate, a first electrically insulating layer formed above the first metallic layer, and a first via formed in the first electrically insulating layer. The first via couples the first winding to a circuit element positioned on the multilayer substrate. A depression is formed in the multilayer substrate, and a polymer solution containing a ferromagnetic component is deposited on a surface of the multilayer substrate above the first winding and in the depression. In an embodiment, the polymer solution is an epoxy. In an embodiment, the ferromagnetic component contains nanocrystaline nickel zinc ferrite. In an embodiment, the depression incompletely penetrates the multilayer substrate. In an embodiment, the polymer solution is deposited within a mold positioned on a surface of the multilayer substrate to form the shape of the polymer solution after curing. In an embodiment, the multilayer substrate comprises a printed wiring board. In an embodiment, an integrated circuit is located on the multilayer substrate that is electrically coupled to the first winding. In an embodiment, the apparatus is a power conversion device. In a further embodiment, a second insulating layer is formed on the multilayer substrate below the first metallic layer, and a second winding of the magnetic device is formed in a second metallic layer of the multilayer substrate. The second metallic layer is formed on the multilayer substrate below the second insulating layer, and a second via is formed in the second insulating layer. The second via electrically couples the second winding to the first winding. In an embodiment, the first via and the second via are metallic vias. In a further embodiment, a third insulating layer is formed on the multilayer substrate below the second metallic layer, and a third metallic layer is formed on the multilayer substrate below the third insulating layer. The third metallic layer forms a further winding of the magnetic device electrically insulated from the first winding. A third via is formed in the third insulating layer to provide an electrical coupling of the further winding to a further circuit element located on the multilayer substrate. In an embodiment, the multilayer substrate is a semiconductor substrate, and the circuit element is an integrated circuit formed on the multilayer substrate.

Another exemplary embodiment provides a method of forming an apparatus. In an embodiment, the method includes forming a first metallic layer of a multilayer substrate, and forming a first winding of a magnetic device in the first metallic layer. The method further includes forming a first electrically insulating layer above the first metallic layer, and positioning a circuit element on the multilayer substrate. The method further includes forming a first via in the first electrically insulating layer to couple the first winding to the circuit element, and forming a depression in the multilayer substrate. The method further includes depositing a polymer solution containing a ferromagnetic component on a surface of the multilayer substrate above the first winding and in the depression. In an embodiment, the polymer solution includes an epoxy. In an embodiment, the ferromagnetic component includes nanocrystaline nickel zinc ferrite. In an embodiment, the depression incompletely penetrates the multilayer substrate. In an embodiment, the method further includes positioning a mold on a surface of the multilayer substrate and depositing the polymer solution in the mold. In an embodiment, the multilayer substrate comprises a printed wiring board. In an embodiment, the apparatus comprises a power conversion device. In an embodiment, the method further includes forming a second insulating layer on the multilayer substrate below the first metallic layer, and forming a second metallic layer on the multilayer substrate below the second insulating layer. The method further includes forming a second winding of the magnetic device in the second metallic layer, and forming a second via in the second insulating layer to electrically couple the second winding to the first winding. In an embodiment, the first via and the second via are metallic vias. In an embodiment, the method further includes forming a third insulating layer on the multilayer substrate below the second metallic layer and forming a third metallic layer on the multilayer substrate below the third insulating layer. The method further includes forming a further winding of the magnetic device in the third metallic layer electrically insulated from the first winding, and locating a further circuit element on the multilayer substrate. The method further includes forming a third via in the third insulating layer to provide an electrical coupling of the further winding to the further circuit element. In an embodiment, the multilayer substrate is formed as a semiconductor substrate, and the circuit element is an integrated circuit formed on the multilayer substrate.

Although processes for forming a device containing a magnetic element and related methods have been described for application to electronic power conversion, it should be understood that other applications of these processes such as for analog signal filtering are contemplated within the broad scope of the invention, and need not be limited to electronic power conversion applications employing processes introduced herein.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. An apparatus, comprising:
   a multilayer substrate comprising a first winding of a magnetic device formed in a first metallic layer of the multilayer substrate;
   a first electrically insulating layer formed above the first metallic layer;
   a first via formed in the first electrically insulating layer, the first via configured to couple the first winding to a connection for a circuit element positioned on the multilayer substrate;
   a depression formed in the multilayer substrate; and
   a polymer solution containing a ferromagnetic component deposited on a surface of the multilayer substrate above the first winding and in the depression.

2. The apparatus as claimed in claim 1, wherein the polymer solution comprises an epoxy.

3. The apparatus as claimed in claim 1, wherein the ferromagnetic component comprises nanocrystaline nickel zinc ferrite.

4. The apparatus as claimed in claim 1, wherein the depression incompletely penetrates the multilayer substrate.

5. The apparatus as claimed in claim 1, wherein the polymer solution is deposited within a mold positioned on a surface of the multilayer substrate.

6. The apparatus as claimed in claim 1, wherein the multilayer substrate comprises a printed wiring board.

7. The apparatus as claimed in claim 1, further comprising an integrated circuit located on the multilayer substrate and electrically coupled to the first winding.

8. The apparatus as claimed in claim 7, wherein the apparatus comprises a power conversion device.

9. The apparatus as claimed in claim 1, further comprising:
   a second insulating layer formed on the multilayer substrate below the first metallic layer;
   a second winding of the magnetic device formed in a second metallic layer of the multilayer substrate, the second metallic layer formed on the multilayer substrate below the second insulating layer; and
   a second via formed in the second insulating layer, wherein the second via electrically couples the second winding to the first winding.

10. The apparatus as claimed in claim 9, wherein the first via and the second via are metallic vias.

11. The apparatus as claimed in claim 9, further comprising:
    a third insulating layer formed on the multilayer substrate below the second metallic layer;
    a third metallic layer formed on the multilayer substrate below the third insulating layer, wherein the third metallic layer forms a further winding of the magnetic device electrically insulated from the first winding; and
    a third via formed in the third insulating layer, wherein the third via provides an electrical coupling of the further winding to a further connection configured to be coupled to a further circuit element located on the multilayer substrate.

12. The apparatus as claimed in claim 11, wherein the multilayer substrate comprises a semiconductor substrate, and wherein the circuit element comprises an integrated circuit formed on the multilayer substrate.

13. The apparatus of claim 9, wherein the second winding is laid out in an opposite geometric winding sense as the first winding.

14. The apparatus of claim 1, wherein the first winding is not completely encircled by the ferromagnetic component.

15. The apparatus of claim 1, wherein a viscosity of the polymer solution is low enough for the polymer solution to fill the depression.

16. A method of forming an apparatus, the method comprising:
    forming a first metallic layer of a multilayer substrate;
    forming a first winding of a magnetic device in the first metallic layer;
    forming a first electrically insulating layer above the first metallic layer;
    forming a first via in the first electrically insulating layer to couple the first winding to a connection configured to be coupled to a circuit element;
    forming a depression in the multilayer substrate; and
    depositing a polymer solution containing a ferromagnetic component on a surface of the multilayer substrate above the first winding and in the depression.

17. The method as claimed in claim 16, wherein the polymer solution comprises an epoxy.

18. The method as claimed in claim 16, wherein the ferromagnetic component comprises nanocrystaline nickel zinc ferrite.

19. The method as claimed in claim 16, wherein the depression incompletely penetrates the multilayer substrate.

20. The method as claimed in claim 16, further comprising positioning a mold on a surface of the multilayer substrate and depositing the polymer solution in the mold.

21. The method as claimed in claim 16, wherein the multilayer substrate comprises a printed wiring board.

22. The method as claimed in claim 16, wherein the apparatus comprises a power conversion device.

23. The method as claimed in claim 16, further comprising:
    forming a second insulating layer on the multilayer substrate below the first metallic layer;
    forming a second metallic layer on the multilayer substrate below the second insulating layer;
    forming a second winding of the magnetic device in the second metallic layer; and
    forming a second via in the second insulating layer to electrically couple the second winding to the first winding.

24. The method as claimed in claim 23, wherein the first via and the second via are metallic vias.

25. The method as claimed in claim 23, further comprising:
forming a third insulating layer on the multilayer substrate below the second metallic layer;
forming a third metallic layer formed on the multilayer substrate below the third insulating layer;
forming a further winding of the magnetic device in the third metallic layer electrically insulated from the first winding; and
forming a third via in the third insulating layer to provide an electrical coupling of the further winding to a further connection configured to be coupled to a further circuit element.

26. The method as claimed in claim 16, wherein the multilayer substrate comprises a semiconductor substrate, and wherein the circuit element comprises an integrated circuit formed on the multilayer substrate.

27. The method as claimed in claim 16, wherein the first winding is not completely encircled by the ferromagnetic component.

28. The method as claimed in claim 16, wherein a viscosity of the polymer solution is low enough for the polymer solution to fill the depression in the multilayer substrate.

29. A transformer comprising:
a first winding disposed in a first metal layer on a first side of a circuit board;
a second winding disposed in a second metal layer on a second side of a circuit board, the second winding positioned opposite the first winding;
a first region of ferromagnetic material disposed on a top surface of the first side of the circuit board and within a first depression formed on the first side of the circuit board, the first winding surrounding the first depression; and
a second region of ferromagnetic material disposed on a top surface of the second side of the circuit board and within a second depression formed on the second side of the circuit board, the second winding surrounding the second depression, wherein the first and second windings are not completely encircled by ferromagnetic material.

30. The transformer of claim 29, wherein the first depression and the second depression are directly opposite each other.

31. The transformer of claim 30, wherein the first depression and the second depression are separated by a first length.

32. The transformer of claim 30, wherein the first region of ferromagnetic material disposed on a top surface of the first side of the circuit board extends at least a first distance above the first winding.

33. A transformer comprising:
a first winding disposed in a first metal layer on a first side of a circuit board;
a second winding disposed in a second metal layer on a second side of a circuit board, the second winding positioned opposite the first winding;
a first region of ferromagnetic material disposed on a top surface of the first side of the circuit board and within a first depression formed on the first side of the circuit board, the first winding surrounding the first depression; and
a second region of ferromagnetic material disposed on a top surface of the second side of the circuit board and within a second depression formed on the second side of the circuit board, the second winding surrounding the second depression.

34. The transformer of claim 33, wherein the first depression and the second depression are directly opposite each other.

35. The transformer of claim 33, wherein the first depression and the second depression are separated by a gap.

36. The transformer of claim 35, wherein a length of the gap is used to control an effective transformer air gap for a path of magnetic flux of the transformer.

37. The transformer of claim 33, wherein further comprising:
a first via formed on the first side of the circuit board adjacent to an outer perimeter of the first winding, the first region of ferromagnetic material filling the first via; and
a second via formed on the second side of the circuit board adjacent to an outer perimeter of the second winding, the second region of ferromagnetic material filling the second via, wherein
the second via is directly opposite the first via, and
the first via and the second via are separated from each other by a gap of a first length.

38. A circuit comprising:
a first winding disposed in a first metal layer on a first side of a circuit board;
a first region of ferromagnetic material disposed on a top surface of the first side of the circuit board and within a first depression formed on the first side of the circuit board, the first winding surrounding the first depression; and
a second region of ferromagnetic material disposed on a top surface of a second side of the circuit board and within a second depression formed on the second side of the circuit board, wherein the first depression and the second depression are separated by a first gap.

39. The circuit of claim 38, wherein the first depression and the second depression are directly opposite each other.

40. The circuit of claim 38, further comprising a second winding disposed in a second metal layer on a second side of a circuit board, the second winding positioned opposite the first winding.

41. The circuit of claim 38, wherein a length of the first gap controls an effective transformer air gap for a path of magnetic flux.

42. The circuit of claim 38, further comprising:
a first via formed on the first side of the circuit board adjacent to an outer perimeter of the first winding, the first region of ferromagnetic material filling the first via; and
a second via formed on the second side of the circuit board directly opposite the first via, the second region of ferromagnetic material filling the second via, wherein the first via and the second via are separated by a second gap.

43. The circuit of claim 42, wherein a length of the second gap controls an effective transformer air gap for a path of magnetic flux.

* * * * *